United States Patent
Tang et al.

(10) Patent No.: US 11,129,273 B2
(45) Date of Patent: Sep. 21, 2021

(54) METAL-CERAMIC SUBSTRATE AND METHOD FOR PRODUCING A METAL-CERAMIC SUBSTRATE

(71) Applicant: Rogers Germany GmbH, Eschenbach (DE)

(72) Inventors: Xinhe Tang, Eschenbach (DE); Andreas Meyer, Wenzenbach (DE); Stefan Britting, Schnaittach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 0 days.

(21) Appl. No.: 16/976,339

(22) PCT Filed: Feb. 27, 2019

(86) PCT No.: PCT/EP2019/054787
§ 371 (c)(1),
(2) Date: Aug. 27, 2020

(87) PCT Pub. No.: WO2019/166454
PCT Pub. Date: Sep. 6, 2019

(65) Prior Publication Data
US 2021/0144846 A1 May 13, 2021

(30) Foreign Application Priority Data
Feb. 28, 2018 (DE) .................... 10 2018 104 532.8

(51) Int. Cl.
*H05K 3/02* (2006.01)
*H05K 1/02* (2006.01)
(Continued)

(52) U.S. Cl.
CPC ............. *H05K 1/0271* (2013.01); *H05K 3/02* (2013.01); *H05K 3/28* (2013.01); *H05K 1/0306* (2013.01); *H05K 2201/09745* (2013.01)

(58) Field of Classification Search
CPC ....................................................... H05K 3/02
(Continued)

(56) References Cited

U.S. PATENT DOCUMENTS

2008/0164588 A1   7/2008   Lee et al.

FOREIGN PATENT DOCUMENTS

DE         4004844 C1     1/1991
DE        19927046 A1    12/2000
(Continued)

OTHER PUBLICATIONS

IPRP of International Application No. PCT/EP2019/054787; International Filing Date Feb. 27, 2019; dated Jul. 31, 2020, 6 pages.

*Primary Examiner* — Stanley Tso
(74) *Attorney, Agent, or Firm* — Cantor Colburn LLP

(57) ABSTRACT

A metal-ceramic substrate (1) comprising
an insulating layer (11) extending along a main extension plane (HSE) and comprising a ceramic, and
a metallisation layer (12) bonded to the insulating layer (11) over a bonding area (A), the bonding area (A) being delimited by at least one edge (K) in a plane parallel to the main extension plane (HSE), characterized in that the edge (K) is at least partially covered with a filling material (2) and an edge region (RB) of the metallisation layer (12) adjoining the edge has a material weakening.

18 Claims, 4 Drawing Sheets

(51) Int. Cl.
*H05K 3/28* (2006.01)
*H05K 1/03* (2006.01)

(58) Field of Classification Search
USPC .......................................................... 174/268
See application file for complete search history.

(56) References Cited

FOREIGN PATENT DOCUMENTS

| | | | |
|---|---|---|---|
| DE | 102010024520 A1 | | 12/2011 |
| DE | 102013226544 A1 | | 8/2014 |
| DE | 102013104739 A1 | | 9/2014 |
| DE | 102013013482 A1 | | 2/2015 |
| DE | 102013013842 | * | 2/2015 |
| DE | 102014220650 A1 | | 4/2016 |
| EP | 0632681 A2 | | 1/1995 |
| EP | 0921565 A2 | | 6/1999 |
| EP | 1089334 A2 | | 4/2001 |
| EP | 1465250 A1 | | 10/2004 |
| JP | H03145748 A | | 6/1991 |
| JP | 2002076197 A | | 3/2002 |
| JP | 2004296465 A | | 10/2004 |

\* cited by examiner

METAL-CERAMIC SUBSTRATE AND METHOD FOR PRODUCING A METAL-CERAMIC SUBSTRATE

CROSS-REFERENCE TO RELATED APPLICATIONS

This application is a National Stage filing of PCT/EP2019/054787, filed Feb. 27, 2019, which claims priority to DE 10 2018 104 532.8, filed Feb. 28, 2018, both of which are incorporated by reference in their entirety herein.

BACKGROUND

The present invention relates to a metal-ceramic substrate for electrical, in particular electronic, components and a method of manufacturing a metal-ceramic substrate.

Metal-ceramic substrates are, for example as printed circuit boards or circuit boards, sufficiently well-known from the state-of-the-art. Typically, on one component side of the metal-ceramic substrate, connection areas for electrical components and conductor tracks are arranged, wherein the electrical components and the conductor tracks can be interconnected to form electrical circuits. Essential components of the metal-ceramic substrates are an insulating layer and a metallisation layer bonded to the insulating layer. Because of their comparatively high insulation strength and their stability against environmental influences, insulating layers made of ceramic have proven to be particularly advantageous. By structuring the metallisation layer, conductor tracks and/or connection areas for the electrical components can be realized.

A weak point with regard to a desired or required thermal shock resistance is regularly found to be a border region between the metallisation layer and the insulating layer along an edge that borders the metallisation layer. Due to different thermal expansion coefficients, i.e. usually a lower thermal expansion coefficient of the insulating layer compared to the thermal expansion coefficient of the metallisation layer, shear stresses occur along a bonding area along which the metallisation layer is bonded to the insulating layer. These shear stresses become maximal at the edge that limits the bonding area and promote crack formation in this area.

In order to improve the thermal shock resistance, EP 0 632 681 A2 proposes material weakening in the metallisation layer, especially in its edge region. DE 10 2010 024 520 A1, on the other hand, teaches to cover trenches in the metallisation layer with a filling material to fill cracks.

SUMMARY

Based on this background, the present invention makes it its object to provide a metal-ceramic substrate which thermal shock resistance is further improved and in particular whose tendency to crack formation is reduced.

This object is achieved by a metal-ceramic substrate and a method as described herein. Further advantages and features of the invention result from the claims and subclaims as well as the description and the attached figures.

BRIEF DESCRIPTION OF THE FIGURES

Further advantages and features result from the following description of preferred embodiments of the subject matter of the invention with reference to the attached figures. It is shown in.

DETAILED DESCRIPTION

Figure 1:
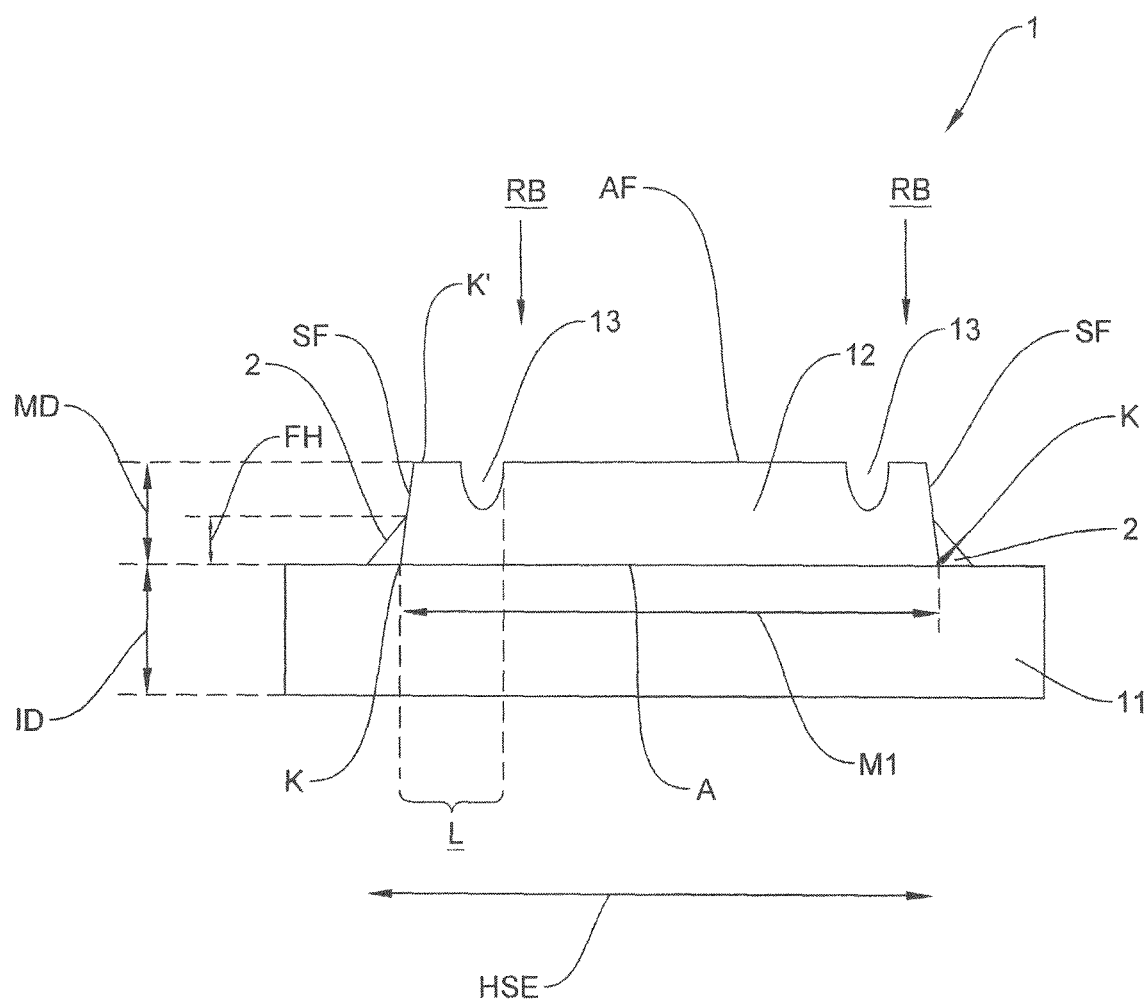
FIG. 1: a metal-ceramic substrate according to a first preferred embodiment of the present invention.

The invention provides a metal-ceramic substrate, wherein the metal-ceramic substrate comprises an insulating layer extending along a main extension plane and comprising a ceramic, and a metallisation layer bonded to the insulating layer over a bonding area, the bonding area being delimited by at least one edge in a plane parallel to the main extension plane.

In order to increase the thermal shock resistance, it is intended that the edge is at least partially covered with a filling material and that an edge area of the metallisation layer adjacent or adjoining to the edge has a material weakening.

Compared to the state of the art, it is intended, according to the invention, to combine the covering of the edge with a filling material and a material weakening of the edge area of the metallisation layer. Surprisingly, it turned out that the combination of these two measures synergistically improves the thermal shock resistance. This means that the combination of both measures improves the thermal shock resistance of the metal-ceramic substrate more than the expected improvement by the sum of the respective measures.

The weakening of the material takes advantage of the fact that thermomechanical stresses also decrease with decreasing metallisation layer thickness. Covering the edge with a filling material has the effect of increasing a volume in an area where shear stresses occur. Microcracks can also be sealed. Sealing the microcracks counteracts moisture absorption, e.g. through capillary condensation, and thus minimizes stress corrosion cracking. In addition to the synergetic effect resulting from the combination of at least partial covering of the edge and of the material weakening, the combination also allows the edge region to be shortened with the material weakening while maintaining the same thermal shock resistance (compared to a metal-ceramic substrate, where only a material weakening in the edge region is provided). This means that one side of the component, via which electronic or electrical components are connected to the metal-ceramic substrate, has a larger connection area available, since in the area with the material weakening no connection of electrical or electronic components makes sense. In other words: the combination according to the invention additionally allows the usable connection area or termination area of the metallisation layer to be increased or optimized.

Preferably, the insulating layer has $Al_2O_3$, $Si_3N_4$, AlN, ZTA (Zirconia Toughened Alumina), MgO, BeO, SiC or high density MgO (>90% of the theoretical density), TSZ (tetragonally stabilized zirconia) or ZTA as material for the ceramic. It is also conceivable that the insulating layer is designed as a composite or hybrid ceramic in which, in order to combine various desired properties, several ceramic layers, each differing in terms of its material composition, are arranged one above the other and joined together to form an insulating layer. Materials conceivable as materials for the metallisation layer are copper, aluminium, molybdenum and/or their alloys as well as laminates, such as CuW, CuMo, CuAl, AlCu and/or CuCu, in particular a copper sandwich structure with a first copper layer and a second copper layer, a grain size in the first copper layer differing from the second copper layer.

In particular, it is intended that the bonding area does not extend over the entire length of the insulating layer along the main extension plane. In other words, the insulating layer protrudes in the direction of the main extension plane opposite the metallisation layer, in particular opposite the edge. Preferably, the metallisation layer is structured and the edge is created as a result of a structuring measure, e.g. etching or surface milling of insulation trenches. A material weakening is in particular a variation or modulation in the thickness of the metallisation layer. Preferably, a ratio of an extension of the edge region to a total length of the metallisation layer measured in the same direction is a value of less than 0.25, preferably less than 0.15 and most preferably less than 0.1. The extension or total length is measured in particular in a direction perpendicular to the course of the edge. In particular, the measurement of the extension starts with the edge and is directed towards a central area of the metallisation layer.

Furthermore, it is preferably provided that an outer surface associated with the edge region, i.e. the side of the metallisation layer facing away from the insulating layer, is smaller than 0.15 times, more preferably smaller than 0.1 times and most preferably smaller than 0.05 times the total outer surface of the metallisation layer facing away from the insulating layer. Preferably it is intended that the edge region, starting from the edge in a plane perpendicular to the course of the edge in the main extension plane, extends up to 1000 μm, more preferably up to 800 μm and most preferably up to 600 μm in the direction of the central region of the metallisation layer. It is also conceivable that the edge region is defined by the extent of the material weakening and extends, for example, in the direction of the central region up to a region of the metallisation layer in which the metallisation layer has its maximum thickness or a constant thickness and no further recesses are provided.

The edge forms a linear boundary for the bonding area, which can be curved, straight or angular, at least in some areas. In particular, the edge is part of the edge region or forms the end of the bonding area or edge area facing away from the central area. The edge encloses or surrounds the bonding surface completely, i.e. on each side of its extension in the main extension plane.

Furthermore, it is preferable that the edge is covered all around, in particular completely, with the filling material. The filling material is suitable for suppressing crack formation at the edge, i.e. to inhibit or even completely prevent crack expansion. The filling material preferably comprises a plastic material such as polyimide, polyamide, epoxy, or polyether ether ketone. It is also conceivable that a ceramic component is added to the plastic material. Examples of such an additive are silicon nitride, aluminium nitride, aluminium oxide, or glass.

It is also conceivable that carbon fibres, glass fibres and/or nanofibres are added to the plastic material. Preferably, it is intended that the filling material is heat resistant, i.e. the filling material does not melt at temperatures which occur during the production of the metal-ceramic substrate after the application of the filling material and/or during soldering. Furthermore, it is preferably provided that the filling material is suitable for forming a firm and good bond with the insulating layer, preferably the selected ceramic material, and the metallisation layer, preferably the selected metal, such as copper. It is further provided that the coefficient of thermal expansion of the filling material is equal to or greater than the coefficient of thermal expansion of the insulating layer and/or the metallisation layer. For example, the thermal expansion coefficient of the filling material is more than three times greater than the thermal expansion coefficient of the metallisation layer.

It is also conceivable that the filling material forms part of a housing. For example, the metal-ceramic substrate can be realised during overmoulding to form a housing by covering the edge with the filling material during overmoulding. It is also conceivable that a further metallisation layer is provided, which is bonded to the side of the insulating layer opposite the metallisation layer. Preferably, the further metallisation layer is connected to the insulating layer via a further bonding area. In particular, the edge on the further bonding area is covered with filling material at least in some areas.

Furthermore, it is conceivable that the filling material at least partially covers a lateral surface of the insulating layer which delimits the insulating layer in the main extension plane. Preferably, the filling material covers or sheaths the lateral surface completely. In doing so, the filling material extends, for example, from the edge of the bonding area to the lateral surface of the insulating layer closest to the main extension plane. The lateral surface preferably runs perpendicular to the bonding area. Preferably, the filling material fills the insulation trench completely, i.e. up to the height of further edge which delimits the termination area of the metallisation in a plane parallel to the main extension plane at the top side.

In particular, it is intended that to cover the edges, the filling material, especially the liquid filling material, is introduced into the insulation trench area and fills it, for example, from bottom to top. In particular, the insulation trench areas are filled up to further edge, which delimits the end surface of the metallisation layer in a plane parallel to the main extension plane. It is also conceivable that the filling material is applied by means of a spraying or sputtering process.

In order to promote the bonding of the filling material, in particular to the insulating layer, it is preferably provided that the insulating layer and/or metallisation layer is surface modified. For example, the insulating layer is subjected to plasma treatment before the filling material is bonded, or the metallisation layer is oxidized. This has the advantage of strengthening the bonding of the filling material, which has a positive effect on the service life of the manufactured metal-ceramic substrate.

It is also conceivable that the filling material covers the edge in several layers. It is also conceivable that different layers of different filling materials are arranged one above the other. This has the advantage that the covering of the edge can be adapted even better to the expected loads.

According to a preferred embodiment of the present invention, it is intended that the material weakening is formed as a recess, in particular a dome-shaped recess. In particular, the recess is recessed into a termination area of the metallisation surface, the termination area being opposite the bonding area and running parallel to the bonding area. The termination area is preferably delimited by a further edge and the recess is offset, in particular with respect to the further edge, in a direction running parallel to the main extension plane. For example, it is intended that the recess is not adjacent to the further edge or forms a part of the further edge. Preferably, the recesses are arranged offset to each other along one or more rows running parallel to the further edge. However, it is also conceivable that the recesses are statistically distributed in the edge region and/or that a density (i.e. a number of recesses per unit area) in the direction of the central area of the metallisation layer varies, for example decreases.

Preferably, it is provided that the filling material extends up to a further edge which delimits the termination area of the metallisation in a plane parallel to the main extension plane at the top side. Furthermore, it is preferably intended that the filling material terminates flush with the further edge in a direction perpendicular to the main extension plane or terminates between the edge and the further edge.

In a further embodiment, it is provided that the filling material overlaps the further edge and fills a recess on the top side of the metallisation. In this way, the edge region is covered and sealed with the filling material up to the recess in an advantageous way.

Furthermore, it is preferable provided that a ratio between the metallisation thickness and the filling material height assumes a value between 0.5 and 0.9, more preferably between 0.6 and 0.8, and most preferably essentially 0.75.

Furthermore, it is preferably provided that the filling material does not completely, i.e. massively, fill an area between two metallisations, i.e. into an iso-trench area. Instead, the filling material has at least one recess or recessed course between the two metallisations.

Furthermore, it is preferably provided that the filling material forms a coating. In this case the filling material, in particular in the form of a coating, extends from the insulating layer to the further edge or extends from the insulating layer to a point between the edge and the further edge.

In particular, it is intended that the filling material extends along the lateral surface which is not parallel to the main extension plane.

It is also conceivable that the recesses are formed on the termination area and/or on the bonding area of the metallisation layer or a further metallisation layer.

For example, several rows of recesses can be arranged one behind the other starting from the further edge of the metallisation layer towards the central area. The recesses can extend over the entire thickness of the metallisation layer, i.e. be continuous, or be only partially etched so that the metallisation layer is only weakened locally at certain points, preferably directly at the further edge. The recesses pass through the metallisation layer or open or end, preferably in the shape of a dome or cupola, inside the metallisation layer. It is also conceivable that the metallisation layer could be designed with hole-like recesses and blind hole-like bores, wherein the number of hole-like recesses is smaller than the number of blind hole-like recesses. Advantageously, a plurality of recesses, in particular a plurality of recesses arranged next to one another, form a meander-shaped, stamp-edge-shaped and/or saw-tooth-shaped course of the further edge, the meander-shaped, stamp-edge-shaped and/or saw-tooth-shaped course in particular extending over the entire edge course or the further edge of the metallisation layer. It is also conceivable that the meander-shaped, stamp-edge-shaped and/or saw-tooth-shaped course of the metallisation layer extends only over a partial area of the entire edge course of the metallisation layer or several partial areas adjoin one another at a distance from one another as viewed in the direction of rotation. By forming a structured course of the further edge, its surface enlargement is designed in such a way that it can be advantageously distributed essentially independently of the location of the occurrence of mechanical stress. However, the course of the edge can also have irregular recesses, i.e. e.g. small and larger recesses which are mixed or alternately arranged to one another, or which are undulated, rectangular, parallelogram-shaped, or jagged.

Preferably, it is provided that a lateral surface of the metallisation layer, which is not parallel to the main extension plane in particular, extends obliquely and/or arcuately at least in sections. In particular, the lateral surfaces connect the bonding area and the termination area, preferably the edge and the further edge, with each other. Due to the oblique and/or arcuate course of the lateral surfaces, material weakening in the edge region can be achieved in a comparatively simple manner. With the oblique course, the lateral surface is preferably inclined by between 45° and 85° relative to the bonding area, more preferably between 60° and 85° and more preferably between 75° and 85°. This has the advantage that the material weakening in a direction parallel to the main extension plane can be dimensioned comparatively short, so that the largest possible termination area of the metallisation layer can be made available for the connection of electronic components. A stepped course is also conceivable. In particular, a stepped course with different step heights is conceivable.

In a further embodiment of the present invention, it is provided that the filling material comprises an organic grout, preferably with a short-term temperature resistance of more than 300° C. By making the filling material resistant to temperatures of more than 300° C. acting on the filling material for a short time, it is advantageously possible to ensure that the filling material is not weakened in a later thermal process, such as chip soldering or silver sintering.

Preferably, the filling material, especially at its thickest point, has a filler thickness of at least 20 μm, more preferably at least 30 μm and most preferably at least 40 μm. The filling material forms an outer surface on a side facing away from the edge and the thickness of the filling material is determined starting from the outer surface along a measuring direction extending perpendicular to the course of the outer surface (i.e. perpendicular to a straight line tangential to the outer surface). It has been found to be advantageous that such small filling material thicknesses are already sufficient to effectively cover the edge. This reduces the risk of soiling the termination area when the edge is covered by the filling material.

It is preferably provided that an insulation trench area between a metallisation layer and a further metallisation layer adjacent in the main extension plane has filling material or the insulating layer in the insulation trench area is completely covered or wetted by the filling material, in particular if the thickness of the filling material varies within the insulation trench area. Such wetting of the insulation trench occurs after the edge has been covered without a post-treatment step. Therefore, no post-treatment is required to produce such a metal-ceramic substrate. It is also conceivable that the insulation trench area could be freed of the filling material at least in some areas by a post-treatment step, in particular by laser treatment.

In a further embodiment of the present invention it is provided that the filling material, in particular at its thinnest point, preferably between the metallisation layer and an adjacent further metallisation layer, has a filling material thickness of less than 30 μm, preferably less than 20 μm and most preferably less than 10 μm. It is preferably provided that the filling material thickness varies along a direction parallel to the main extension plane. Therefore, the filling material thickness can be adjusted advantageously to the expected shear stress in the region of the edge. At the same time, a superfluous filling, in particular between two metallisation layers adjacent to each other in a direction parallel to the main extension plane, i.e. the metallisation layer and a further metallisation layer, is avoided.

Preferably, the filler thickness above the edge is maximal and/or decreases in a direction parallel to the main extension plane and perpendicular to the course of the edge in the direction of the etching trench. This has the advantage of increasing the volume by means of the filling material in a particularly susceptible area, namely above the edge. This contributes significantly to the improvement of the thermal shock resistance by covering with the filling material. The term above should preferably be understood in the measuring direction. Furthermore, it has proven to be particularly advantageous if the thickness of the filling material, especially in the area of the edge or in the area of the filling material that is directly on the insulating layer, is as flat as possible in order to further reduce the reduction of mechanical stresses. Preferably, a flat course is defined as an inclination of the outer surface of the filling material relative to the bonding area of less than 25°, more preferably less than 15° and most preferably less than 10°. It is preferably provided that the course of the outer surface of the filling material is determined by the course of the lateral surface of the metallisation layer. Preferably, the thickness of the filling material decreases continuously and/or steadily.

According to a further embodiment of the present invention, it is provided that a filling material height is less than a metallisation layer thickness. Preferably, a ratio between the filling material height FH to the metallisation layer thickness MD assumes a value between 0.5 and 0.9, and more preferably between 0.6 and 0.85.

In other words. The side faces remain at least partially free of filling material, in particular in a region facing the termination area. Therein it is provided that the thickness of the filling material should be greater than 10 µm, as lower layer thicknesses are assumed to be no longer mechanically relevant. The reduction of the filling material height can be realized, for example, by only partially filling the insulation trench area. The reduced filling material height has the advantage that the probability of contamination of the termination area by the filling material during covering can be avoided. However, it is also conceivable that the filling material height extends to the further edge of the termination area.

It is further provided that the metal-ceramic substrate comprises a ceramic insulating layer having a first thickness, and a metallisation layer bonded to the insulating layer having a second thickness, the second thickness being greater than 200 µm and the first thickness being less than 300 µm, the first thickness and the second thickness being dimensioned such that a ratio of an amount of the difference between a thermal expansion coefficient of the metallisation layer and a thermal expansion coefficient of the metal-ceramic substrate to the thermal expansion coefficient of the metal-ceramic substrate takes a value less than 0.25, preferably less than 0.2 and most preferably less than 0.15, or even less than 0.1.

Compared to the state of the art, it is possible with the aforementioned design or dimensioning of the first thickness and the second thickness with advantage to realize an improved thermal shock resistance, in particular also for such metal-ceramic substrates whose thermal resistance is reduced by a comparatively thin insulating layer, i.e. with a first thickness smaller than 250 µm, preferably smaller than 200 µm and most preferably smaller than 150 µm. Preferably, the thermal expansion coefficient of the metal-ceramic substrate (i.e. the total thermal expansion coefficient, which takes into account all layers, in particular the insulating layer and the metallisation layer) and the thermal expansion coefficient of the metallisation layer are used for dimensioning the first and/or the second thickness. Surprisingly, it turned out that despite the comparatively small first thicknesses of the insulating layer, the thermal shock resistance can be improved if the second thickness or first thickness is dimensioned according to requirements. In particular, it has been shown that the smaller the difference between the coefficient of thermal expansion of the metallisation layer and the coefficient of thermal expansion of the metal-ceramic substrate, the lower the failure of a metal-ceramic substrate under thermal shock.

A further advantage, apart from the reduced thermal resistance of the comparatively thin insulating layer, is that the number and size of structural defects decreases with decreasing layer thickness. Accordingly, the probability of failure of a ceramic insulating layer decreases. The first thickness and the second thickness are measured along a direction perpendicular to the main extension plane, with the main extension plane parallel to the insulating layer. The metallisation layer is directly attached to the insulating layer via a bonding area.

Thermal shock resistance is preferably understood to be a tearing of the insulating layer in the area of the boundary to the metallisation layer. This tearing in turn leads to delamination as the number of cycles increases. The service life of the metal-ceramic substrate, which can be observed under temperature changes, ends when a crack can be detected by US microscopy, which in turn hinders the heat dissipation below the heat sources or in the area of half the copper thickness around the heat source or restricts the insulating strength of the substrate. It has been found that the lifetime observed under temperature change can be extended if the metal-ceramic substrate is dimensioned according to demanding requirements.

Preferably, the insulating layer comprises $Al_2O_3$, $Si_3N_4$, AlN, a HPSX ceramic (i.e. a ceramic with an $Al_2O_3$ matrix that comprises an x-percent portion of $ZrO_2$, for example $Al_2O_3$ with 9% $ZrO_2$=HPS9 or $Al_2O_3$ with 25% $ZrO_2$=HPS25), SiC, BeO, MgO, or high-density MgO (>90% of the theoretical density), TSZ (tetragonally stabilized zirconium oxide) as the material for the ceramic. It is also conceivable that the insulating layer is designed as a composite or hybrid ceramic in which, in order to combine various desired properties, several ceramic layers, each differing in terms of its material composition, are arranged one above the other and joined together to form an insulating layer. The materials conceivable as materials for the metallisation layer are copper, aluminium, molybdenum and/or their alloys, as well as laminates such as CuW, CuMo, CuAl, AlCu and/or CuCu, in particular a copper sandwich structure with a first copper layer and a second copper layer, a grain size in the first copper layer differing from a second copper layer.

Furthermore, it is conceivable that the insulating layer could be made of zirconium-reinforced alumina, for example, which has the advantage of increasing the stability of the insulating layer, while an insulating layer of $Al_2O_3$, for example, can be produced comparatively low-cost.

For example, an insulating layer made of HPS9 ceramic has a first thickness of 0.26 mm or 0.32 mm if the second thickness of the metallisation layer made of copper is essentially 0.6 mm.

According to a further embodiment of the present invention, it is provided that the first thickness is greater than 30

µm, preferably greater than 60 µm and most preferably greater than 90 µm. It has been found that such first thicknesses can ensure a corresponding insulation strength and stability of the metal-ceramic substrate. In addition, the manufacturing costs for insulating layers with a first thickness of more than 90 µm are lower than those for thinner insulating layers. Preferably, it is provided that on the side opposite the metallisation layer a further metallisation layer with a third thickness is bonded to the insulating layer, the first thickness, the second thickness and/or the third thickness being dimensioned such that a ratio
- of an amount of the difference between a thermal expansion coefficient of the further metallisation layer and/or the metallisation layer and a thermal expansion coefficient of the metal-ceramic substrate to
- the thermal expansion coefficient of the metal-ceramic substrate
- assumes a value less than 0.25, more preferably less than 0.2 and most preferably less than 0.15, or even less than 0.1.

The metal-ceramic substrate is preferably thermomechanically symmetrical. In particular, the metallisation layer, the insulating layer and the further metallisation layer are arranged one above the other along a stacking direction perpendicular to the main extension plane. The third thickness is dimensioned in a direction perpendicular to the main extension plane. Preferably, the thermal expansion coefficient of the further metallisation layer or the metallisation layer is selected which is closer to the thermal expansion coefficient of the metal-ceramic substrate. It is obvious to the expert that the formulated conditions are transferable to metal-ceramic substrates composed of more than three layers. Preferably, such a multilayer metal-ceramic substrate with more than three layers can be transferred to a metal-ceramic substrate with an insulating layer, a metallisation layer, and another metallisation layer, i.e. a three-layer metal-ceramic substrate. Preferably, the material for the second metallisation layer is selected so as to increase the stiffness of the entire metal-ceramic substrate. This allows the mechanical load-bearing capacity of the entire metal-ceramic substrate to be specifically adjusted. It is conceivable that the material for the first metallisation layer differs from the metal of the second metallisation layer. For example, the material for the further metallisation layer is molybdenum. Also conceivable as materials for the further metallisation layer are copper, aluminium, tungsten and/or their alloys, as well as laminates such as CuW, CuMo, CuAl, AlCu and/or CuCu, in particular a copper sandwich structure with a first copper layer and a second copper layer, whereby a grain size in the first copper layer differs from a second copper layer. Furthermore, backside metallizations based on MMC's such as CuSiC, CuC, AlSiC or MgSiC are also conceivable, the CTE of which can be adapted in particular to the combined CTE of the substrate. It is particularly preferred that the further metallisation layer is between 1.1 and 10 times as thick, preferably between 1.5 and 8 and most preferably between 2 and 6 times as thick as the metallisation layer.

Preferably, for stabilization, the further metallisation layer is free of interruptions, in particular free of insulation trenches. This prevents the metal-ceramic substrate in the area of the insulation trenches from being formed only by the thin insulating layer and being correspondingly susceptible to breakage in this area. In other words, the further metallisation layer serves as a stabilizing layer for the comparatively thin insulating layer. It is also conceivable that the metallisation and the further metallisation are designed in such a way that, along the stacking direction, insulation trenches in the metallisation layer and the insulation trenches in the further metallisation layer are not arranged one above the other. It has also been found that despite the asymmetrical design of the further metallisation layer and the metallisation layer, comparatively long service times can be realized. Preferably, the further metallisation layer extends further than the metallisation layer in a direction parallel to the main extension plane. This means that the further metallisation layer protrudes from the metallisation layer in a direction parallel to the main extension plane. It is also conceivable that the further metallisation layer is thicker than the metallisation layer in order to ensure sufficient stability of the metal-ceramic substrate. In other words, the thicker further metallisation layer at least partially compensates for the reduced thickness of the insulating layer.

In a further embodiment of the present invention, it is provided that the second thickness and/or third thickness is greater than 350 µm, and most preferably greater than 500 µm. The second thickness of the metallisation layer, which is larger than the first thickness, serves advantageously to limit the heating of the conductor tracks by ohmic losses in a current conduction, to spread the heat below the heat sources and to minimize bending of the metal-ceramic substrate. This can be ensured in particular for thicknesses above 500 µm for a majority of the different metallisation layers.

Preferably, the coefficient of thermal expansion depends on a modulus of elasticity, a Poisson number, and/or a material-specific coefficient of thermal expansion. In particular, the following relationship applies $$CTE = \frac{\sum_{i=1}^{n} CTE_i \cdot \frac{E_i}{(1-\eta_i)} \cdot Di}{\sum_{i=1}^{n} \cdot \frac{E_i}{(1-\eta_i)} \cdot Di},$$

where Di denotes the i-th thickness of n layers with the respective $CTE_i$. In addition, the shape of the respective layer and its modulus of elasticity $E_i$ is taken into account via the Poisson number $\eta_i$. By means of this correlation, the respective coefficient of thermal expansion can be determined on the basis of material-specific sizes and dimensioning data, which allows a comparison between the respective coefficients of thermal expansion.

It is advisable that the second thickness and the third thickness are essentially the same. Preferably, the metallisation layer and the other metallisation layer are made of the same material. It is also conceivable that the third thickness and/or the choice of material are adapted to the further metallisation layer in order to realize a desired size dimension of the metallisation layer and the insulating layer.

A further aspect of the present invention is a further metal-ceramic substrate, wherein an insulating layer extending along a main extension plane and comprising a ceramic, and a metallisation layer bonded to the insulating layer over a bonding area, the bonding area being delimited by at least one edge in a plane parallel to the main extension plane, characterized in that a filling material thickness above the edge is maximal and/or decreases in a direction parallel to the main extension plane. All the features described for the preceding metal-ceramic substrate, in particular with regard to the filling material thickness, and their advantages can likewise be transferred analogously to this further metal-ceramic substrate and vice versa.

Another aspect of the present invention is a method for manufacturing a metal-ceramic substrate, in particular according to a metal-ceramic substrate according to the invention, comprising the steps Providing an insulating layer extending along a main extension plane and comprising a ceramic, Bonding a metallisation layer to form a bonding area which is delimited by an edge in a plane parallel to the main extension plane, and Formation of a material weakening in the metallisation layer in an edge region adjoining to the edge, wherein the edge is covered with a filling material. All features described for the metal-ceramic substrate according to the invention and their advantages can also be transferred analogously to the method according to the invention and vice versa.

It has been shown to be advantageous that when combining an edge covering with a material weakening in the edge region, bonding by means of an AMB process and a DCB-leads to the same thermal shock resistance, i.e. the combination allows the same thermal shock resistance to be achieved regardless of the process used. This is surprising, since AMB bonding without the combination of these measures gives three times better thermal shock resistance. Thus, the combination of edge coverage and material weakening, according to the invention, proves to be particularly advantageous because it allows a more flexible choice between the available methods without having to fear a deterioration in thermal shock resistance.

A "DCB process" (Direct Copper Bond Technology) or a "DAB process" (Direct Aluminium Bond Technology) is understood by the expert to be such a process which serves, for example, to bond metal layers or sheets (e.g. copper sheets or foils or aluminium sheets or foils) to each other and/or to ceramics or ceramic layers, using metal or copper sheets or metal or copper foils which have a layer or coating (fusible layer) on their surface sides. In this process, described for example in U.S. Pat. No. 3,744,120 A or DE23 19 854 C2, this layer or coating (fusible layer) forms a eutectic with a melting temperature below the melting temperature of the metal (e.g. copper), so that by placing the foil on the ceramic and heating all the layers, they can be bonded together by melting the metal or copper essentially only in the area of the fusible layer or oxide layer.

In particular, the DCB process then has, for example, the following process steps:

Oxidizing a copper foil in such a way that a uniform copper oxide layer is obtained;

Placing the copper foil on the ceramic layer;

Heating the composite to a process temperature between about 1025 to 1083° C., e.g. to about 1071° C.;

Cooling down to room temperature.

An active solder process, e.g. for joining metal layers or metal foils, in particular also copper layers or copper foils with ceramic material, is a process which is also used in particular for the production of metal-ceramic substrates, a joint is produced between a metal foil, for example copper foil, and a ceramic substrate, for example aluminium nitride ceramic, at a temperature between approx. 650-1000° C. using a brazing solder which, in addition to a main component such as copper, silver and/or gold, also contains an active metal. This active metal, which is for example at least one element of the group Hf, Ti, Zr, Nb, Ce, forms a connection between the solder and the ceramic by chemical reaction, while the connection between the solder and the metal is a metallic brazing connection. Alternatively, a thick-film process can also be imagined for bonding.

Preferably, it is provided that the metallisation layer is bonded to the insulating layer by means of a DCB process or a DAB process. Surprisingly, it has been found that a particularly large improvement in thermal shock resistance can be achieved if the metallisation layer is bonded to the insulating layer by means of a DCB process.

In the sense of the invention, the term essentially means deviations from the exact value in each case by +/−15%, preferably by +/−10% and most preferably by +/−5% and/or deviations in the form of changes which are insignificant for the function.

FIG. 1 shows a metal-ceramic substrate 1 according to a first preferred embodiment of the present invention. Such metal-ceramic substrates 1 preferably serve as carriers of electronic or electrical components which can be attached to the metal-ceramic substrate 1. Essential components of such a metal-ceramic substrate 1 are an insulating layer 11 extending along a main extension plane and a metallisation layer 12 bonded to the insulating layer 11. This insulating layer 11 is made of at least one material comprising a ceramic. It is also conceivable that the insulating layer 11 comprises a composite ceramic, i.e. an insulating layer 1 which is composed of several ceramic layers. The metallisation layer 12 is bonded to the insulating layer 11 over a bonding area A. For example, the insulating layer has an insulating layer thickness ID or first thickness between 100 and 1000 μm and the metallisation layer has a metallisation layer thickness MD or second thickness of essentially 0.6 mm.

Furthermore, the metallisation layer 12 has a termination area AF on the side opposite to the bonding area A, via which electrical or electronic components can be connected to the metallisation layer 12. The bonding area A and the opposite termination area AF in a direction perpendicular to the main extension plane HSE are connected to each other via lateral surface SF. Preferably, the terminating area AF is limited by a further edge K' in a plane parallel to the main extension plane HSE.

In particular, the bonding area A is limited by an edge K in a parallel to the main extension plane. This means that the edge K forms a linear transition between the metallisation layer 12 and the insulating layer 11 on a visible side of the metal-ceramic substrate 1. An edge region RB of the metallisation layer adjoins the edge K in a direction parallel to the main extension plane HSE. A length L of the edge region RB running parallel to the main extension plane HSE to a total length M1 of the metallisation layer 11 dimensioned in the same direction is preferably less than 0.25, more preferably less than 0.15 and most preferably less than 0.1.

In the embodiment shown in FIG. 1, dome-shaped recesses 13 on the termination area AF are embedded in the metallisation layer 12 in the edge region RB. These dome-shaped recesses 13 represent a material weakening. In addition to the material weakening, it is provided that the edge K is covered with a filling material 2 at least in some areas. It has been found that the combination of material weakening in the edge region RB and covering the edge K with a filling material 2 synergistically improves the thermal shock resistance, i.e. the combination of both measures improves the thermal shock resistance more than the improvement that would be expected from the two measures improving the thermal shock resistance in their sum.

It is conceivable here that a filling material height FH measured perpendicular to the main extension plane HSE does not correspond to the metallisation layer thickness MD, but is smaller. Preferably, a ratio between the filling material height FH and the metallisation layer thickness MD assumes a value between 0.5 and 0.9, and more preferably between 0.6 and 0.85. In other words. The lateral surfaces SF remain at least partially free of filling material with a layer thickness greater than 10 µm. Furthermore, it is provided that, in order to weaken the material of the edge region RB, the side surfaces SF extend obliquely to a direction perpendicular to the main extension plane HSE.

Figure 2:
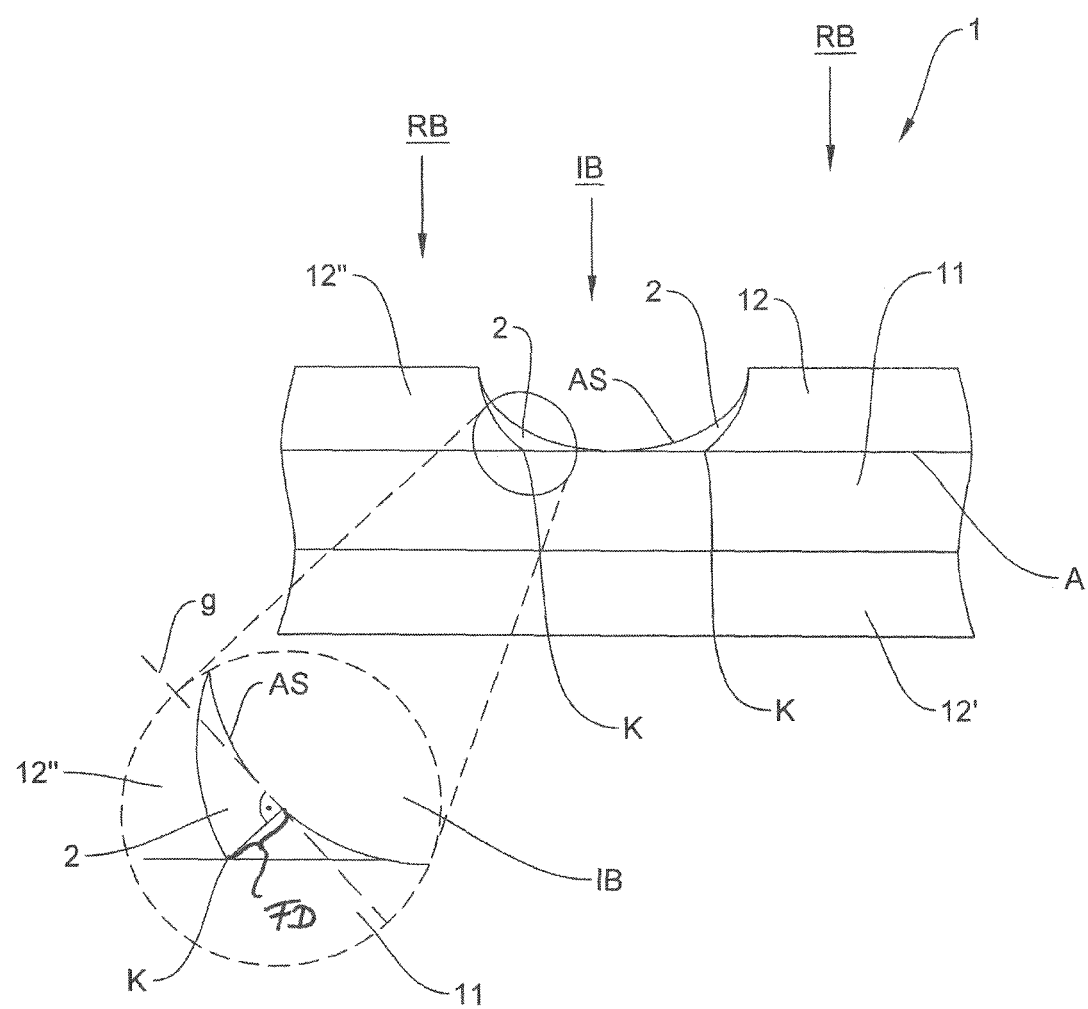
FIG. 2: a metal-ceramic substrate according to a second preferred embodiment of the present invention.

FIG. 2 shows a metal-ceramic substrate according to a second preferred embodiment of the present invention. The embodiment in FIG. 2 differs from that in FIG. 1 in that the lateral surface SF is curved. Such a curved lateral surface is produced, for example, by a controlled etching and represents a material weakening of the edge region RB. Furthermore, FIG. 2 shows an insulation trench area IB, which is arranged in a direction parallel to the main extension plane HSE between the metallisation layer 12 and an adjacent metallisation layer 12". Furthermore, as an example, a further metallisation layer 12' is arranged on the side of the insulating layer 11 facing away from the metallisation layer 12 or the adjacent metallisation layer 12". In particular, the insulation trench area IB is located between an edge K of the metallisation layer 12 and an edge K of the adjacent metallisation layer 12", as seen in a direction parallel to the main extension plane HSE. Furthermore, the filling material 2 is bent on its outer surface AS facing away from the edge K. It is preferably provided that a filling material thickness FD changes along a direction parallel to the main extension plane HSE. The filling material thickness FD is measured in a direction perpendicular to an imaginary straight line g, which in turn extends tangentially to the outer surface AS of the filling material 2 facing away from the edge.

Preferably, the filling material thickness FD is maximal in the area above the edge K (above refers to a direction parallel to the measuring direction) and decreases with increasing distance from the edge K in a direction parallel to the main extension plane HSE. Preferably, the insulation trench area IB is at least partially free of filling material, i.e. there is an area between the metallisation layer 12 and the adjacent metallisation layer 12" in which no filling material 2 is provided. However, it is also conceivable that the filling material thickness between the metallisation layer 12 and the adjacent metallisation layer 12" has a value of less than 10 µm, preferably less than 5 µm and most preferably less than 1 µm.

EXAMPLE I

The following tests on thermal shock resistance were carried out on metal-ceramic substrates 1, which have an
  insulating layer 11 consisting of an HPS9 ceramic layer with an insulating layer thickness ID of 0.32 mm and
  a metallisation layer 12 and a further metallisation layer 12' each consisting of a 0.6 mm copper layer.

For this purpose, the investigations of the thermal shock resistance were carried out between −55° C. and 150° C.

To weaken the material, dome-shaped recesses 13 were made in the edge area RB in the metallisation layer 12 and an epoxy resin was used as filling material 2. The investigations on thermal shock resistance were carried out for
  a metal-ceramic substrate type I, which has only the material weakening and no filling material 2,
  metal-ceramic substrate type II, the edge K of which is covered with a filling material 2 and has no material weakening in the edge region, and
  metal-ceramic substrate type III, the edge K of which is covered with a filling material 2 and has the material weakening in the form of the dome-shaped recesses 13. The metal-ceramic substrate type I, metal-ceramic substrate type II and metal-ceramic substrate type III were each produced once with a DCB process and once with an AMB process.

The metal-ceramic substrate type I showed a 100% improvement in thermal shock resistance when produced by the AMB process or no improvement when produced by the DCB process.

For the metal-ceramic substrate type II, an improvement in thermal shock resistance of 700% was shown when produced by the DCB process, or no improvement when produced by the AMB process.

The metal-ceramic substrate type III showed an improvement of 1500% in thermal shock resistance when produced by DCB process or an improvement of 500% when produced by AMB process.

The following results can therefore be taken from the tests:
  a combination of weakening the material and covering the edge K with the filling material has a synergetic effect on the thermal shock resistance, and
  this synergistic effect depends on the manufacturing process of the metal-ceramic substrate.

Figure 3:
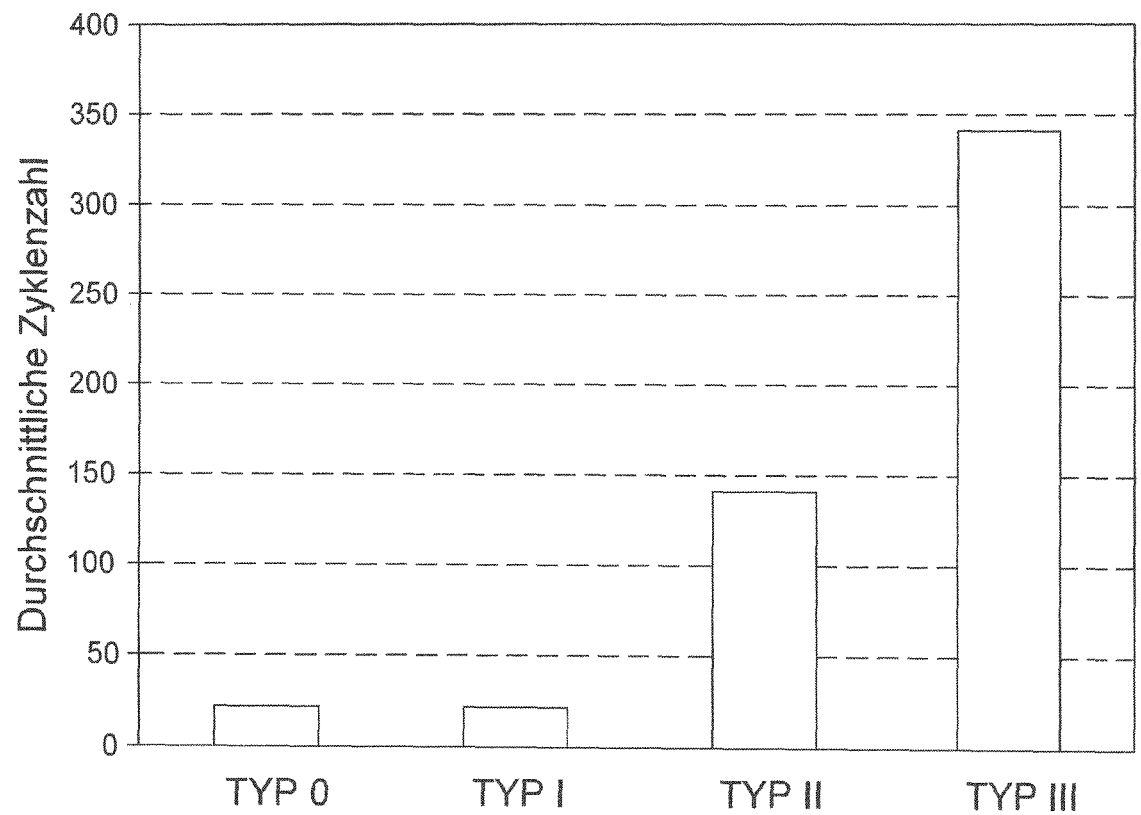
FIG. 3: test results showing thermal shock resistance for metal ceramic substrates created by DCB bonding, and in FIG. 4: test results showing thermal shock resistance for metal ceramic substrates created by AMB bonding.
Figure 4:
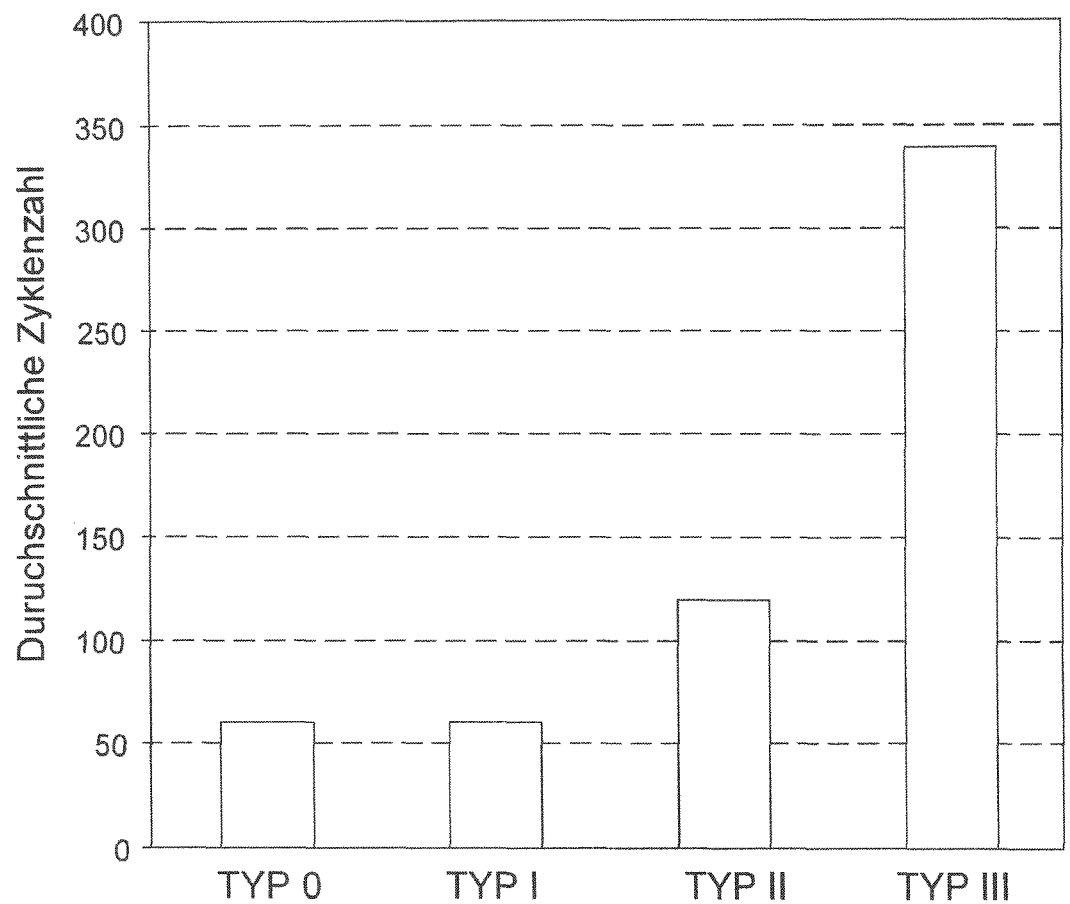

The test results presented here are again presented in FIGS. 3 and 4, in which the average number of cycles after which delamination or tearing of the insulating layer was detected for the aforementioned metal-ceramic substrate types, is shown in a bar chart. Within a cycle, the respective metal-ceramic substrate is subjected to a temperature fluctuation between −55° and 150° and thus the number of cycles after which a deletion or tearing of the insulating layer is detected is recorded. The average number of cycles is thus a measure of the thermal shock resistance of the metal-ceramic substrate. The tests have also shown that the thermal shock resistance is reduced if the edge is not completely covered, i.e. all around. Type 0 is defined as metal-ceramic substrates which were only bonded using the DCB or AMB process without covering the edge with a filling material and/or weakening the material in the edge area. FIG. 3 illustrates those for metal-ceramic substrates produced by the DCB process and FIG. 4 those produced by the AMB process.

LIST OF REFERENCES SIGNS

1 Metal-ceramic substrate
2 Filling material
11 Insulating layer
12 Metallisation layer
12' Further metallisation layer
12" Adjacent metallisation layer
13 Recess
g Straight line
HSE main extension plane
K Edge
K' Further edge
HF Filling material height
MD Metallisation layer thickness
RB Edge region
AS Outer surface
IB Insulation trench area
FD Filling material thickness
SF Lateral surface
A bonding area AF Termination Area
L Length of the termination area
M1 Total length of the metallisation layer

The invention claimed is:

1. A metal-ceramic substrate (1) comprising
an insulating layer (11) extending along a main extension plane (HSE) and comprising a ceramic, and
a metallisation layer (12) bonded to the insulating layer (11) over a bonding area (A), the bonding area (A) being delimited by at least one edge (K) in a plane parallel to the main extension plane (HSE),
wherein the edge (K) is at least partially covered with a filling material (2) and an edge region (RB) of the metallisation layer (12) adjoining the edge (K) has a material weakening, and wherein the material weakening is formed as recess (13), characterized in that
the filling material (2) overlaps the further edge (K') and fills a recess (13) on the top side of the metallisation layer and/or
a ratio between the metallisation layer thickness (MD) and the filling material height (FH) assumes a value between 0.5 and 0.9 and/or
the filling material (2) terminates flush with the further edge (5) in a direction perpendicular to the main extension plane (HSE).

2. The metal-ceramic substrate (1) according to claim 1, wherein the material weakening is formed as a dome-shaped recess (13).

3. The metal-ceramic substrate (1) according to claim 1, wherein the filling material (2) extends up to a further edge (K') which delimits the termination area (AF) of the metallisation layer (12) in a plane parallel to the main extension plane (HSE) at the top side.

4. The metal-ceramic substrate (1) according to claim 1, wherein the filling material (2) comprises an organic grout.

5. The metal-ceramic substrate (1) according to claim 1, wherein the filling material (2) at its thickest point, has a filling material thickness (FD) of at least 20 µm.

6. The metal-ceramic substrate (1) according to claim 1, wherein the filling material (2) at its thinnest point has a filling material thickness (FD) of less than 30 µm.

7. The metal-ceramic substrate (1) according to claim 1, wherein a filling material thickness (FD) above the edge (K) is maximal and/or decreases in a direction parallel to the main extension plane (HSE).

8. A method of manufacturing a metal-ceramic substrate (1) according claim 1, comprising the steps:
providing the insulating layer (11) extending along a main extension plane (HSE) and comprising the ceramic,
bonding the metallisation layer (12) to form the bonding area (A) which is delimited by at the least one edge (K) in the plane parallel to the main extension plane (HSE), and
forming the material weakening in the metallisation layer (12) in the edge region (RB) adjoining the edge (K),
wherein the edge (K) is covered with the filling material (2).

9. The method according to claim 8, wherein the metallisation layer (12) is bonded to the insulating layer (11) by means of a DCB process.

10. A metal-ceramic substrate (1) comprising
an insulating layer (11) extending along a main extension plane (HSE) and comprising a ceramic, and
a metallisation layer (12) bonded to the insulating layer (11) over a bonding area (A), the bonding area (A) being delimited by at least one edge (K) in a plane parallel to the main extension plane (HSE), characterized in that the edge (K) is at least partially covered with a filling material (2) and an edge region (RB) of the metallisation layer (12) adjoining the edge (K) has a material weakening a lateral surface (SF) of the metallisation layer (12) which is not parallel to the main extension plane (HSE) extends obliquely and/or arcuately at least in sections.

11. The metal-ceramic substrate (1) according to claim 10, wherein the material weakening is formed as a dome-shaped recess (13).

12. The metal-ceramic substrate (1) according to claim 10, wherein the filling material (2) extends up to a further edge (K') which delimits the termination area (AF) of the metallisation layer (12) in a plane parallel to the main extension plane (HSE) at the top side.

13. The metal-ceramic substrate (1) according to claim 10, wherein the filling material (2) comprises an organic grout.

14. The metal-ceramic substrate (1) according to claim 10, wherein the filling material (2) at its thickest point, has a filling material thickness (FD) of at least 20 µm.

15. The metal-ceramic substrate (1) according to claim 10, wherein the filling material (2) at its thinnest point has a filling material thickness (FD) of less than 30 µm3.

16. The metal-ceramic substrate (1) according to claim 10, wherein a filling material thickness (FD) above the edge (K) is maximal and/or decreases in a direction parallel to the main extension plane (HSE).

17. A method of manufacturing a metal-ceramic substrate (1) according claim 10, comprising the steps:
providing an insulating layer (11) extending along a main extension plane (HSE) and comprising a ceramic,
bonding a metallisation layer (12) to form a bonding area (A) which is delimited by at least one edge (K) in a plane parallel to the main extension plane (HSE), and
forming of a material weakening in the metallisation layer (12) in an edge region (RB) adjoining the edge (K),
wherein the edge (K) is covered with a filling material (2).

18. The method according to claim 17, wherein the metallisation layer (12) is bonded to the insulating layer (11) by means of a DCB process.

* * * * *